United States Patent
Avanzino et al.

(10) Patent No.: US 7,306,988 B1
(45) Date of Patent: Dec. 11, 2007

(54) MEMORY CELL AND METHOD OF MAKING THE MEMORY CELL

(75) Inventors: Steven C. Avanzino, Cupertino, CA (US); Wen Yu, Fremont, CA (US)

(73) Assignees: Advanced Micro Devices, Inc., Austin, TX (US); Spansion LLC, Sunnyvale, CA (US)

( * ) Notice: Subject to any disclaimer, the term of this patent is extended or adjusted under 35 U.S.C. 154(b) by 517 days.

(21) Appl. No.: 11/063,138

(22) Filed: Feb. 22, 2005

(51) Int. Cl.
*H01L 21/8242* (2006.01)

(52) U.S. Cl. .................. 438/252; 438/687; 438/387; 257/40; 257/301; 257/43; 257/E21.66

(58) Field of Classification Search ............... 438/252, 438/687, 387; 257/40, 301, 43, E21.66
See application file for complete search history.

(56) References Cited

U.S. PATENT DOCUMENTS

| | | |
|---|---|---|
| 6,498,098 B1 * | 12/2002 | Abe .......................... 438/687 |
| 6,656,763 B1 | 12/2003 | Oglesby et al. |
| 6,686,263 B1 | 2/2004 | Lopatin et al. |
| 6,746,971 B1 | 6/2004 | Ngo et al. |
| 6,753,247 B1 | 6/2004 | Okoroanyanwu et al. |
| 6,768,157 B2 | 7/2004 | Krieger et al. |
| 6,770,905 B1 | 8/2004 | Buynoski et al. |
| 6,773,954 B1 | 8/2004 | Subramanian et al. |
| 6,781,868 B2 | 8/2004 | Bulovic et al. |
| 6,787,458 B1 | 9/2004 | Tripsas et al. |
| 6,803,267 B1 | 10/2004 | Subramanian et al. |
| 6,825,060 B1 | 11/2004 | Lyons et al. |
| 6,852,586 B1 | 2/2005 | Buynoski et al. |
| 7,141,482 B1 * | 11/2006 | Avanzino .................... 438/387 |
| 7,148,144 B1 * | 12/2006 | Avanzino .................... 438/687 |
| 2005/0006643 A1 * | 1/2005 | Lan et al. ...................... 257/40 |
| 2005/0045877 A1 * | 3/2005 | Lyons et al. .................. 257/40 |

* cited by examiner

*Primary Examiner*—Asok K. Sarkar
*Assistant Examiner*—Victor V. Yevsikov
(74) *Attorney, Agent, or Firm*—Amin, Turocy & Calvin, LLP

(57) ABSTRACT

Methods of making memory devices/cells are disclosed. A memory cell contains first and second electrode layers and a controllably conductive media therebetween. The controllably conductive media contains a copper sulfide-containing passive layer and active layer containing a Cu-doped tantalum oxide and/or titanium oxide layer. Methods of using the memory devices/cells, and devices such as computers containing the memory devices/cells are also disclosed.

21 Claims, 4 Drawing Sheets

MEMORY CELL AND METHOD OF MAKING THE MEMORY CELL

TECHNICAL FIELD

The subject invention generally relates to a memory cell containing a first electrode and second electrode and a controllably conductive media therebetween. In particular, the controllably conductive media contains a passive layer, an active layer containing a Cu-doped metal oxide layer.

BACKGROUND ART

In the semiconductor industry, there is a continuing trend toward higher device densities. To achieve the high densities there have been, and continue to be, efforts toward scaling down device dimensions (e.g., at sub-micron levels) on semiconductor wafers. In order to accomplish such high device packing densities, smaller feature sizes and more precise feature shapes are required. This may include the width, thickness and spacing of interconnecting lines, spacing and diameter of contact holes, and the surface geometry, such as corners and edges, of various features.

The requirement of small features with close spacing between adjacent features requires sophisticated manufacturing techniques to ensure that quality and operability of the features are not compromised for the purpose of reducing feature size. Among the many aspects related to improving semiconductor fabrication processing to achieve higher density devices, the ability to form thin film layers, which are substantially free from impurities and defects, remains critical to the structural integrity of smaller features as well as to the performance of the device with respect to increasing the speed of the device. Even minor impurities or defects present on the thin film layer tend to result in poor device characteristics, thereby reducing the effectiveness of the semiconductor device.

Thus, an efficient method to form a thin film is desired to increase productivity, quality, and reliability in IC manufacture.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The subject invention provides a memory cell containing a first electrode and a second electrode, and a controllably conductive media therebetween. The controllably conductive media contains a passive layer and an active layer containing a Cu-doped metal oxide layer containing at least one of tantalum oxide and titanium oxide. The memory cell containing the controllably conductive media possess one or more of the following: capability to store multiple bits of information, short resistance/impedance switch time, low operating voltages, low cost, high reliability, long life (thousands/millions of cycles), capable of three dimensional packing, associated low temperature processing, high density/integration, and extended memory retention.

One aspect of the subject invention relates to a method of making a memory cell. The method includes providing a dielectric layer having a first electrode formed therein; forming a passive layer containing at least copper sulfide over the first electrode; forming a Cu-doped metal oxide layer containing at least one of tantalum oxide and titanium oxide over the passive layer; and forming a second electrode layer over the Cu-doped metal oxide layer.

Another aspect of the subject invention relates a memory cell made by a method. The method includes providing a dielectric layer having a first electrode formed therein; forming a passive layer containing at least copper sulfide over the first electrode; forming a Cu-doped metal oxide layer containing at least one of tantalum oxide and titanium oxide over the passive layer; and forming a second electrode layer over the Cu-doped metal oxide layer.

To the accomplishment of the foregoing and related ends, the invention contains the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF THE INVENTION

The subject invention involves a memory cell containing a first electrode and a second electrode, and a controllably conductive media therebetween. The controllably conductive media contains a passive layer containing copper sulfide and an active layer containing a Cu-doped metal oxide layer containing at least one of tantalum oxide and titanium oxide.

Another aspect of the subject invention relates a method of making a memory cell and a memory cell made by the method. The method includes providing a dielectric layer having a first electrode formed therein; forming a passive layer containing at least copper sulfide over the first electrode; forming a Cu-doped metal oxide layer containing at least one of tantalum oxide and titanium oxide over the passive layer; and forming a second electrode layer over the Cu-doped metal oxide layer. The Cu-doped metal oxide layer containing at least one of tantalum oxide and titanium oxide may be formed by oxidizing a portion of the passive layer containing copper sulfide layer to form the copper oxide layer, forming a metal layer containing at least one of tantalum and titanium over the copper oxide layer, by oxidizing the metal layer with oxygen from the copper oxide layer to form a metal oxide layer containing at least one of tantalum oxide and titanium oxide, and by doping the metal oxide layer with copper from the copper oxide layer to form the Cu-doped metal oxide layer containing at least one of tantalum oxide and titanium oxide.

A memory cell contains at least two electrodes, as one or more electrodes may be deposited between the two electrodes that sandwich a controllably conductive media. The electrodes are made of conductive material, such as conductive metal, conductive metal alloys, conductive metal oxides, conductive polymer films, semiconductive materials, and the like. The controllably conductive media contains an active layer and a passive layer.

The memory cells may optionally contain additional layers, such as additional electrodes, charge retention layers, and/or chemically active layers between or in addition to the two electrodes and the controllably conductive media. The impedance of the controllably conductive media changes when an external stimulus such as an applied electric field is imposed. A plurality of memory cells, which may be referred to as an array, forms a memory device.

Figure 1:
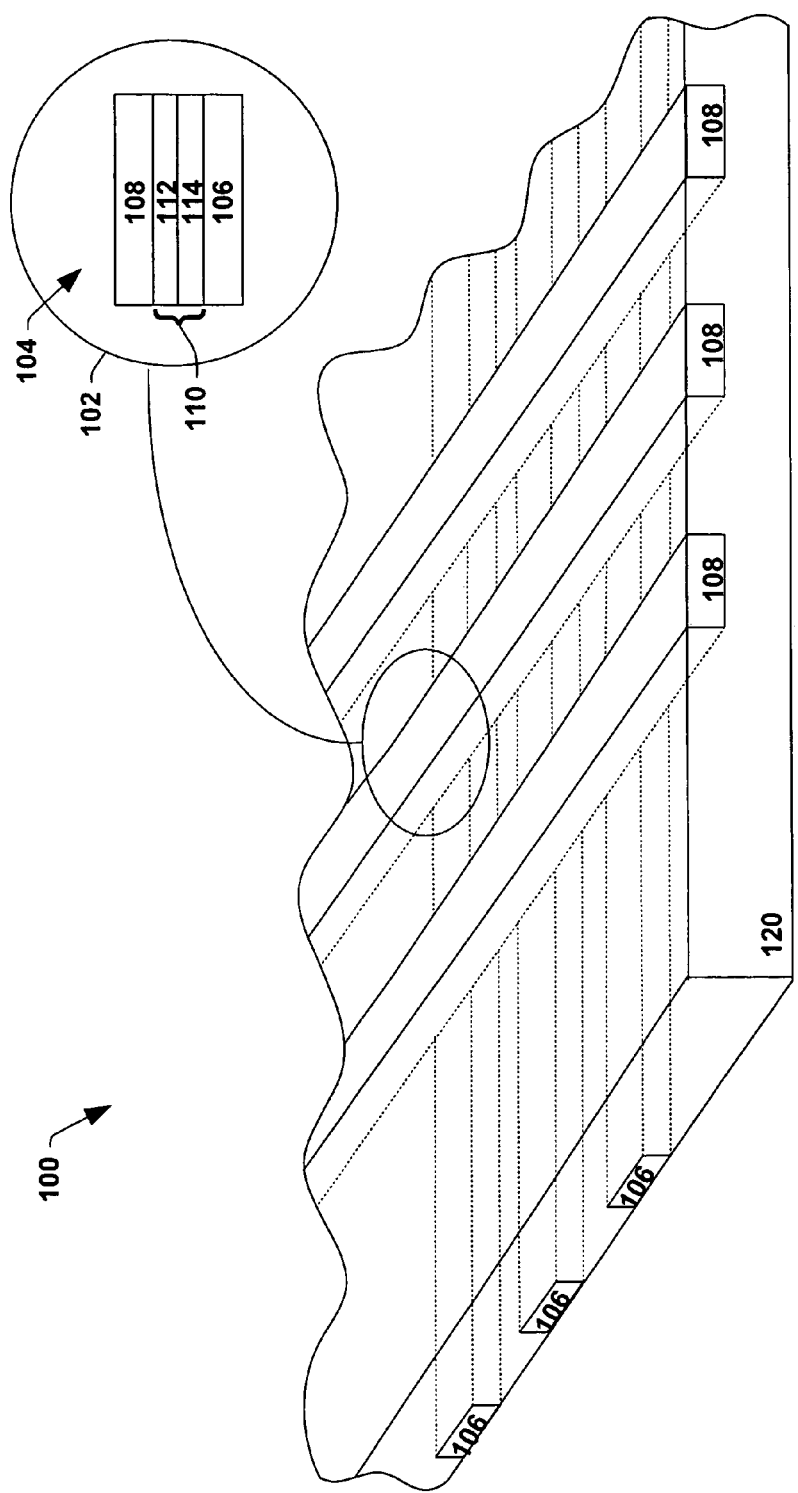
FIG. 1 illustrates a perspective view of a three dimensional microelectronic device containing a plurality of memory cells in accordance with one aspect of the subject invention.

Referring to FIG. 1, a brief description of a microelectronic memory device 100 containing a plurality of memory cells 104 formed in a dielectric layer 120 in accordance with one aspect of the invention is shown, as well as an exploded view 102 of an exemplary memory cell 104. The microelectronic memory device 100 contains a desired number of memory cells, as determined by the number of rows, columns, and layers (three dimensional orientation described later) present. The first electrodes 106 and the second electrodes 108 are shown in substantially perpendicular orientation, although other orientations are possible to achieve the structure of the exploded view 102. Each memory cell 104 contains a first electrode 106 and a second electrode 108 with a controllably conductive media 110 therebetween. The controllably conductive media 110 contains one or more an active layers 112 and one or more passive layer 114. Peripheral circuitry and devices are not shown for brevity.

The memory cells 104 may be formed in a dielectric layer 120. Any suitable dielectric material can be used as the dielectric layer 120. Both organic and inorganic dielectric materials may be used. Similarly, both low and high k dielectrics may be used. In addition, polymeric, amorphous, crystalline and monomeric materials can be used as dielectric materials. Non-limiting examples of dielectric materials may include silicon containing spin-on glasses such as alkoxysilane polymer, a siloxane polymer, a silsesquioxane polymer, a poly(arylene ether), a fluorinated poly(arylene ether), other polymer dielectrics, nanoporous silica or mixtures thereof.

The dielectric layer 120 can be formed on any substrate (not shown) by any suitable technique. For example, chemical vapor deposition (CVD) such as plasma enhanced chemical vapor deposition (PECVD), low-pressure chemical vapor deposition (LPCVD), and high pressure chemical vapor deposition (HPCVD) can be used. Polymeric dielectrics can also be formed by using spin-coating, dip-coating, or spraying. Optionally, prior to formation of dielectric layer 120 one or more layers of insulators, barriers, metal interconnects, and/or passivization layers can be formed on the substrate.

The dielectric layer 120 has a suitable thickness that facilitates subsequent fabrication procedures and depends upon the chosen implementations and/or the memory device being fabricated Typically, dielectric layer 120 has a thickness from about 0.04 µm to about 100 µm. In one embodiment of the subject invention, dielectric layer 120 has a thickness from about 0.2 µm to about 50 µm. In another embodiment of the subject invention, dielectric layer 120 has a thickness from about 0.5 µm to about 6 µm. The dielectric layer 120 may be formed over substantially the entire surface of the substrate. In one embodiment of the subject invention, the dielectric layer 100 may be formed on part of the surface of the substrate.

The memory cells 104 contain at least two electrodes, as one or more electrodes may be disposed between the two electrodes that sandwich the controllably conductive media 110. The electrodes are made of conductive material, such as conductive metal, conductive metal alloys, conductive metal oxides, conductive polymer films, semiconductive materials, and the like.

Examples of electrodes include one or more of aluminum, chromium, cobalt, copper, germanium, gold, magnesium, manganese, molybdenum, indium, iron, nickel, palladium, platinum, silver, titanium, tungsten, zinc, and alloys thereof, indium-tin oxide (ITO) and indium zinc oxide and other conductive metal oxides; polysilicon; doped amorphous silicon; metal silicides, metal carbides, and metal nitrides; and the like. Alloy electrodes specifically include Hastelloy®, Kovar®, Invar, Monel®, Inconel®, brass, stainless steel, magnesium-silver alloy, and various other alloys.

When a copper sulfide-containing passive layer 114 is formed on the surface of an electrode 106 by contacting a sulfur compound with the electrode 106, the electrode 106 that is adjacent the copper sulfide-containing passive layer 114 contains at least copper, so as to permit formation of a copper sulfide-containing passive layer 114 by the sulfur treatment. In one embodiment, the electrode 106 that is adjacent the copper sulfide-containing layer contains at least 50% by weight copper.

The electrode 106, 108 has a suitable thickness that depends upon the chosen implementations and/or the memory device being fabricated. In one embodiment, the thickness of each electrode is independently about 0.01 µm or more and about 10 µm or less. In another embodiment, the thickness of each electrode is independently about 0.05 µm or more and about 5 µm or less. In yet another embodiment, the thickness of each electrode is independently about 0.1 µm or more and about 1 µm or less.

The controllably conductive media 110, disposed between the two electrodes 106, 108, can be rendered conductive or non-conductive in a controllable manner using an external stimulus. Generally, in the absence of an external stimulus, the controllably conductive media is non-conductive or has a high impedance. Further, in some embodiments, multiple degrees of conductivity/resistivity may be established for the controllably conductive media 110 in a controllable manner. For example, the multiple degrees of conductivity/resistivity for the controllably conductive media 110 may include a non-conductive state, a highly conductive state, and a semi-conductive state.

The controllably conductive media 110 can be rendered conductive, non-conductive or any state therebetween (degree of conductivity) in a controllable manner by an external stimulus (e.g., originating from outside the controllably conductive media). For example, under an external electric field, radiation, and the like, a given non-conductive controllably conductive media is converted to a conductive controllably conductive media.

The controllably conductive media 110 contains one or more active layers 112 and one or more passive layers 114. The active layer 112 of the subject invention can be formed using Cu-doped metal oxide containing at least one of tantalum oxide and titanium oxide. The active layer 112 can be formed using techniques well known to a person in the art.

The active layer 112 has a suitable thickness that depends upon the chosen implementations and/or the memory device being fabricated. In one embodiment, the active layer 112 has a thickness of about 25 Å or more and about 110 Å or less. In another embodiment, the active layer 112 has a thickness of about 35 Å or more and about 95 Å or less. In yet another embodiment, the active layer 112 has a thickness of about 50 Å or more and about 80 Å or less.

In one embodiment, the active layer 112 contains a thin layer designed to improve or lengthen charge retention time. The thin layer may be placed anywhere within the active layer 112, but typically near the middle of the layer. The thin layer contains any of the electrode materials or the compounds of the below-described heterocyclic/aromatic compound layer. In one embodiment, the thin layer has a thickness of about 50 Å or more and about 0.1 µm or less. In another embodiment, the thin layer has a thickness of about 100 Å or more and about 0.05 µm or less. For example, a memory cell may contain a first electrode 106 of copper, a passive layer 114 of copper sulfide, an active layer 112 of Cu-doped tantalum oxide and/or titanium oxide, and a second electrode of aluminum, wherein the active layer 112 contains a 50 Å thick layer of copper therein.

In one embodiment, the active layer 112 is not doped with a salt. In another embodiment, the active layer 112 is doped with a salt. A salt is an ionic compound having an anion and cation. General examples of salts that can be employed to dope the active layer 112 include alkaline earth metal halogens, sulfates, persulfates, nitrates, phosphates, and the like; alkali metal halogens, sulfates, persulfates, nitrates, phosphates, and the like; transition metal halogens, sulfates, persulfates, nitrates, phosphates, and the like; ammonium halogens, sulfates, persulfates, nitrates, phosphates, and the like; quaternary alkyl ammonium halogens, sulfates, persulfates, nitrates, phosphates, and the like.

The Cu-doped metal oxide-containing active layer 112 contains at least one of tantalum oxide (e.g., $Ta_2O_5$) and titanium oxide (e.g., $TiO_2$). The active layer 112 is formed by any suitable techniques. For example, the active layer 112 may be formed by oxidizing a portion of the passive layer 114 containing copper sulfide layer to form the copper oxide layer, forming a metal layer containing at least one of tantalum and titanium over the copper oxide layer, by oxidizing the metal layer with oxygen from the copper oxide layer to form a metal oxide layer containing at least one of tantalum oxide and titanium oxide, and by doping the metal oxide layer with copper from the copper oxide layer to form the Cu-doped metal oxide layer containing at least one of tantalum oxide and titanium oxide. Alternatively, the Cu-doped metal oxide layer is formed by forming a metal oxide layer containing at least one of tantalum oxide and titanium oxide and by incorporating the metal oxide layer with Cu ion by implantation technique.

The copper oxide layer may be formed by oxidizing the surface of the passive layer 114 containing copper sulfide. The copper oxide layer typically contains the general formula CuO and/or $Cu_2O$. The oxidation of the passive layer 114 may occur by exposing the passive layer 114 to oxygen ambient at lower than about 200° C. or by contacting the passive layer 114 with oxidation solution. The copper oxide layer has a suitable thickness that depends upon the chosen implementations and/or the memory device being fabricated. In one embodiment, the copper oxide layer has a thickness of about 5 Å or more and about 50 Å or less. In another embodiment, the copper oxide layer has a thickness of about 10 Å or more and about 40 Å or less. In yet another embodiment, the copper oxide layer has a thickness of about 20 Å or more and about 30 Å or less. Since oxygen normally present in air can oxidize the surface of copper sulfide, the thickness of the copper oxide layer will be a function of time when the copper sulfide-containing passive layer 114 is exposed to the ambient atmosphere.

The metal layer containing at least one of tantalum and titanium may be formed over the copper oxide layer by any suitable method, as long as the method does not damage the underlining layers such as the copper oxide layer. For example, the metal layer may be formed by physical vapor deposition (PVD) using a sputtering system, a vacuum vapor deposition system, or the like. In order not to destroy the underlining layer during the PVD deposition, the deposition process may include a low temperature degas (e.g., less than about 150° C.) and/or a low power deposition with low substrate bias to minimize kinetic energy of impinging tantalum and/or titanium atoms. The metal layer may be formed over the entire surface of the structure, or a mask such as a patterned photoresist may cover portions of the surface of the structure, thus limiting metal layer formation to the portions of the structure exposed through the openings in the mask.

The metal layer containing at least one of tantalum and titanium has a suitable thickness that depends upon the chosen implementations and/or the memory device being fabricated. In one embodiment, the metal layer has a thickness of about 10 Å or more and about 40 Å or less. In another embodiment, the metal layer has a thickness of about 15 Å or more and about 35 Å or less. In yet another embodiment, the metal layer has a thickness of about 20 Å or more and about 30 Å or less.

The metal layer containing at least one of tantalum and titanium over the copper oxide layer regions is oxidized to form a metal oxide layer containing at least one of tantalum oxide and titanium oxide. For example, where the metal layer contains tantalum, the tantalum is oxidized to form a tantalum oxide. Tantalum has different oxidation states, and therefore, different tantalum oxides can result from the oxidation of tantalum. For the subject invention, the nature of the tantalum oxide is not critical. The metal layer can be oxidized using any suitable method. For example, the metal layer may be oxidized by chemical oxidation, anodic oxidation, thermal oxidation, or the like. In one embodiment, the tantalum-containing metal layer is exposed to air ambient to allow surface oxidation to convert tantalum to tantalum oxide. In another embodiment, the tantalum is oxidized to tantalum oxide, owing to gettered oxygen from the underlining copper oxide layer. In yet another embodiment, in order to enhance the metal oxidation, the metal layer may be oxidized by heating the layer or by employing a wet chemical oxidation. The metal oxidation may occur during or subsequent to the tantalum and titanium layer formation. The metal oxidation of the tantalum and/or titanium causes the conductive metal layer to change into an insulating metal oxide layer.

The metal oxide layer containing at least one of tantalum oxide and titanium oxide has a suitable thickness that depends upon the chosen implementations and/or the memory device being fabricated. In one embodiment, the metal oxide layer has a thickness of about 20 Å or more and about 60 Å or less. In another embodiment, the metal oxide layer has a thickness of about 25 Å or more and about 55 Å or less. In yet another embodiment, the metal oxide layer has a thickness of about 30 Å or more and about 50 Å or less.

The metal oxide layer containing at least one of tantalum oxide and titanium oxide is doped with copper to form the Cu-doped metal oxide layer 112. The metal oxide layer is formed over the surface of the copper oxide layer, and thus the metal oxide layer is doped with copper from the copper oxide layer. That is, the underlining copper oxide layer provides a plurality of Cu ions to the metal oxide layer. In one embodiment, when the tantalum layer is oxidized with oxygen from the copper oxide layer, the copper oxide layer is reduced to copper. The copper diffuses into the tantalum oxide layer, thus doping the tantalum oxide layer with copper. Heating or annealing the substrate may facilitate doping the metal oxide layer with copper. Heating or annealing process may be performed for a time and at a temperature sufficient to facilitate doping the metal oxide layer. In one embodiment, the substrate is heated for doping for a time from about 0.5 minutes to about 60 minutes at a temperature from about 150° C. to about 500° C. The doping of the metal oxide layer may occur during or subsequent to the oxidation of the metal layer.

Close contact is required to provide good charge carrier/electron exchange between the active layer 112 and the active layer 114. The active layer 112 and the passive layer 114 are electrically coupled in that charge carrier/electron exchange occurs between the two layers.

The passive layer 114 can contain at least one conductivity-facilitating compound that contributes to the controllably conductive properties of the controllably conductive media 110. The conductivity-facilitating compound has the ability to donate and accept charge carriers (ions, holes and/or electrons). The passive layer 114 thus may transport charge carriers between an electrode and the active layer/active layer interface, facilitate charge-carrier injection into the active layer, and/or increase the concentration of charge carriers in the active layer. In some instances, the passive layer 114 may store opposite charges thereby providing a balance of charges in the memory device as a whole. Storing charges/charge carriers is facilitated by the existence of two relatively stable oxidation states for the conductivity-facilitating compound.

Generally, the conductivity facilitating compound or an atom in the conductivity-facilitating compound has at least two relatively stable oxidation states. The two relatively stable oxidation states permit the conductivity-facilitating compound to donate and accept charges and electrically interact with the active layer 112. The particular conductivity facilitating compound employed in a given memory cell is selected so that the two relatively stable oxidation states match with the two relatively stable oxidation states of the material of the active layer. Matching the energy bands of two relatively stable oxidation states of the material of the active layer and the conductivity facilitating compound facilitate charge carrier retention in the active layer 112.

Matching energy bands means that the Fermi level of the passive layer is close to the valence band of the active layer 112. Consequently, the injected charge carrier (into the active layer) may recombine with the charge at the passive layer if the energy band of the charged active layer 112 does not substantially change. Matching energy bands involves compromising between ease of charge injection and length of charge (data) retention time.

The applied external field can reduce the energy barrier between passive layer 114 and active layer 112 depending on the field direction. Therefore, enhanced charge injection in the forward direction field in programming operation and also enhanced charge recombination in reversed field in erase operation can be obtained.

The passive layer 114 contains at least copper sulfide. It is noted that the term copper sulfide layer or region in a memory cell 104 refers to a portion of a memory element or memory cell that contains $Cu_xS_y$, as a conductivity-facilitating compound. In one embodiment, x and y are independently from about 0.5 to about 4. In another embodiment, x and y are independently from about 0.75 to about 3. Common examples of $Cu_xS_y$ compounds include $Cu_2S_3$, CuS, $Cu_{1.5}S$, $Cu_2S$, $Cu_{2.5}S$, $Cu_3S$, and the like. For simplicity and brevity, all such copper sulfide layers falling within the noted $Cu_xS_y$ formula are generically referred to as copper sulfide layers. The conductivity-facilitating compound does not dissociate into ions under the strength of the electric field. The passive layer 114 may contain two or more sub-passive layers, each sub-layer containing the same, different, or multiple conductivity facilitating compounds.

The passive layer 114 may be on/between electrodes grown using oxidation techniques, formed by chemical vapor deposition (CVD) optionally including a gas reaction or gas phase deposition, formed by physical vapor deposition (PVD) including vacuum evaporation, implantation techniques, and sputter deposition, and the like. It is to be appreciated that any suitable passive layer formation processes may be employed with the subject invention. Choice of a suitable passive layer formation process depends primarily on the identity of the passive layer material, size of substrates being processed, and to some extent, the composition of an electrode layer or dielectric layer. It is important to understand that each of the various passive layer formation processes has its own set of features and characteristics well known in the art.

In one embodiment, a passive layer 114 may be formed using CVD techniques. Any suitable passive layer formation components using CVD techniques may be employed with the subject invention. For example, an atmospheric pressure CVD (APCVD), low-pressure CVD (LPCVD), plasma-enhanced CVD (PECVD), high density CVD (HDCVD), or high density plasma (HDP) may be employed.

In one embodiment, a passive layer 114 may be formed by a PECVD. The PECVD typically contains a plasma generating component and a gas delivery component. The PECVD can form various types of passive layer 114 that includes one or more of the following: copper sulfide ($Cu_2S$, CuS) copper oxide (CuO, $Cu_2O$), manganese oxide ($MnO_2$), titanium dioxide ($TiO_2$), indium oxide ($I_3O_4$), silver sulfide ($Ag_2S$, AgS), iron oxide ($Fe_3O_4$), and the like. In accordance with one or more aspects of the subject invention, the PECVD may form a thin film of conductivity facilitating material such as copper sulfide ($CU_2S$, CuS) on a conductive layer to act as a passive layer 114 and facilitate conductivity between the conductive layer and other layers that will subsequently be formed to contain a stack making up a memory cell. The PECVD introduces a gaseous form of copper sulfide above a first electrode 106, with helium optionally being utilized as a carrier gas, through the gas delivery component. The PECVD may optionally utilize a metal organic gas precursor in the process which facilitates depositing the conductivity facilitating compound at a relative low pressure and temperature conditions (e.g., about 0.2 Pa. and from about 200° C. to about 300° C., respectively). The metal organic precursor can be, for example, chelate Cu (II) diethyldithiocarbamate or $Cu(S_2CN(C_2H_5)_2)_2$ (II).

In one embodiment, the passive layer 114 may be formed using oxidation techniques. For example, a passive layer 114 containing copper sulfide is formed by contacting a sulfide compound with a first electrode 106 containing copper in the following manner. When a copper sulfide layer is employed as a passive layer 114, the copper sulfide layer is formed in memory structure by initially and optionally removing or reducing copper oxide that be present on the structure containing at least copper. The copper oxide structure may be a copper electrode or a copper pad within an electrode, the electrode with a copper pad or copper electrode adjacent to the subsequently formed copper sulfide passive layer 114. Copper oxide tends to be very porous, and thus by removing or reducing copper oxide if present, uniformity in the thickness of the subsequently formed copper sulfide layer is improved. Moreover, removing copper oxide facilitates the formation of a copper sulfide layer with the exposed or upper regions of the structure containing at least copper.

Copper oxide removal or reduction, if performed, is carried out in any suitable manner. In one embodiment, the copper oxide on the first electrode 106 may be removed by contacting a reducing agent such as $NH_3$ with the structure. In another embodiment, the copper oxide on the first electrode 106 may be heated at sufficient temperature and for a sufficient period of time to facilitate oxide removal/reduction. When heating the structure containing the copper oxide, the atmosphere contains one or more inert gases, with or without ammonia, and preferably consists essentially of one or more inert gases. In this connection, in one embodiment, when heating the structure containing the copper oxide, the atmosphere contains essentially a nitrogen gas.

After optional copper oxide removal/reduction, a sulfide compound is contacted with the first electrode 106 containing at least copper to form a copper sulfide layer 116. The copper sulfide may be formed over the entire surface of the structure containing at least copper, or a mask such as a patterned photoresist may cover portions of the surface of the structure, thus limiting copper sulfide formation to the portions of the structure exposed through the openings in the mask.

The sulfide compound is capable of reacting with copper to form a copper sulfide layer within or on the original structure containing at least copper. Sulfide compounds include Group IA element sulfides. Examples of sulfide compounds include hydrogen sulfide, lithium sulfide, sodium sulfide, potassium sulfide, and the like.

The sulfide compound is contacted with the first electrode 106 containing at least copper in the form of a sulfide compound mixture. In one embodiment, the sulfide compound mixture contains from about 0.1% to about 100% by weight of at least one sulfide compound and from about 0% to about 99.9% by weight of at least one inert gas. For example, the sulfide compound mixture may contain about 2% by weight of at least one sulfide compound and about 98% by weight of at least one inert gas.

The sulfide compound is contacted with the first electrode 106 containing at least copper for a time at a temperature and at a pressure sufficient to facilitate formation of a layer of copper sulfide in a portion of the structure. In one embodiment, the sulfide compound is contacted with the first electrode 106 containing at least copper for a time from about 1 second to about 60 minutes at a temperature from about 15° C. to about 500° C. and at a pressure from about 0.0001 Torr to about 1,000 Torr.

The passive layer 114 has a suitable thickness that depends upon the chosen implementations and/or the memory device being fabricated. In one embodiment, the passive layer 114 has a thickness of about 7 Å or more and about 0.1 μm or less. In another embodiment, the passive layer 114 has a thickness of about 10 Å or more and about 0.01 μm or less. In yet another embodiment, the passive layer 114 has a thickness of about 50 Å or more and about 0.05 μm or less.

In order to facilitate operation of the memory cells 104, the active layer 112 may be thicker than the passive layer 114. In one embodiment, the thickness of the active layer 112 is from about 1.1 to about 10 times greater than the thickness of the passive layer 114. In another embodiment, the thickness of the active layer 112 is from about 1.5 to about 3 times greater than the thickness of the passive layer 114.

Operation of the memory devices/cells is facilitated using an external stimulus to achieve a switching effect. The external stimuli include an external electric field and/or light radiation. Under various conditions, the memory cell 104 is either conductive (low impedance or "on" state) or non-conductive (high impedance or "off" state).

The memory cell 104 may further have more than one conductive or low impedance state, such as a very highly conductive state (very low impedance state), a highly conductive state (low impedance state), a conductive state (medium level impedance state), and a non-conductive state (high impedance state) thereby enabling the storage of multiple bits of information in a single memory cell 104, such as 2 or more bits of information or 4 or more bits of information.

Switching the memory cell 104 to the "on" state from the "off" state occurs when an external stimuli such as an applied electric field exceeds a threshold value $V_{on}$. Switching the memory cell 104 to the "off" state from the "on" state occurs when an absolute value of external stimuli exceeds an absolute value of another threshold $V_{off}$. The threshold values vary depending upon a number of factors including the identity of the materials that constitute the memory cell 104 and the passive layer 114, the thickness of the various layers, and the like.

Generally speaking, the presence of an external stimuli such as an applied electric field that exceeds a threshold value $V_{on}$ permits an applied voltage to write and that is less than threshold value $V_{off}$ to erase information into/from the memory cell 104 and the presence of an external stimuli such as an applied electric field that is less than $V_{on}$ but more than $V_{off}$ permits an applied voltage to read information from the memory cell 104.

To write information into the memory cell 104, a voltage or pulse signal that exceeds the threshold is applied. To read information written into the memory cell 104, a voltage or electric field of any polarity is applied. Measuring the impedance determines whether the memory cell 104 is in a low impedance state or a high impedance state (and thus whether it is "on" or "off"). To erase information written into the memory cell 104, a negative voltage or a polarity opposite the polarity of the writing signal that exceeds a threshold value is applied.

The memory devices described herein can be employed to form logic devices such as central processing units (CPUs); volatile memory devices such as DRAM devices, SRAM devices, and the like; input/output devices (I/O chips); and non-volatile memory devices such as EEPROMs, EPROMs, PROMs, and the like. The memory devices may be fabricated in planar orientation (two dimensional) or three-dimensional orientation containing at least two planar arrays of the memory cells 104.

Figure 2:
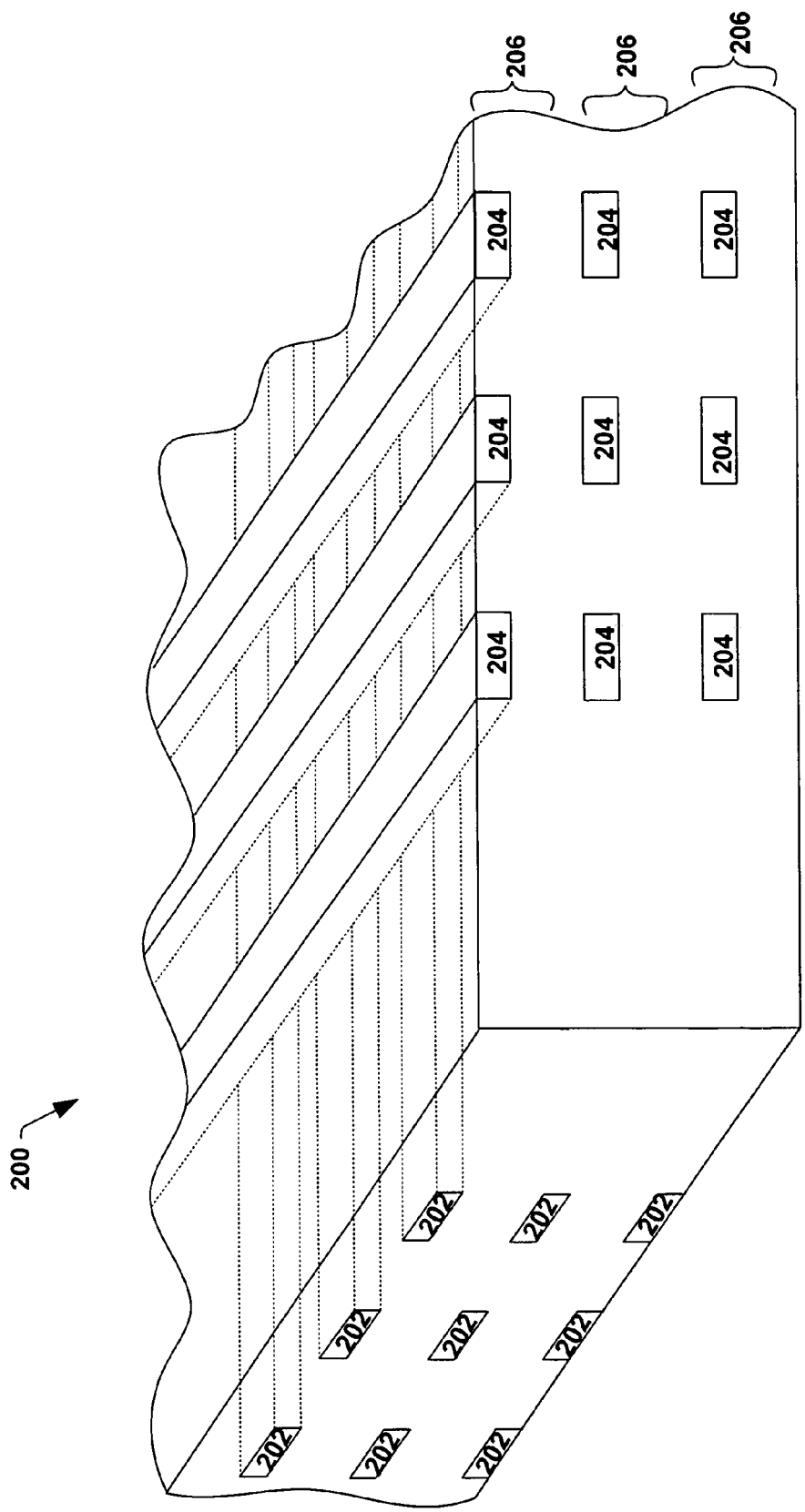
FIG. 2 illustrates a perspective view of a three dimensional microelectronic device containing a plurality of memory cells in accordance with one aspect of the subject invention.

Referring to FIG. 2, a three-dimensional microelectronic memory device 200 containing a plurality of memory cells in accordance with an aspect of the invention is shown. The three-dimensional microelectronic memory device 200 contains a plurality of first electrodes 202, a plurality of second electrodes 204, and a plurality of memory cell layers 206. Between the respective first and second electrodes are the controllably conductive media (not shown). The plurality of first electrodes 202 and the plurality of second electrodes 204 are shown in substantially perpendicular orientation, although other orientations are possible. The three-dimensional microelectronic memory device is capable of containing an extremely high number of memory cells thereby improving device density. Peripheral circuitry and devices are not shown for brevity.

The impedance of the controllably conductive media changes when an external stimulus such as an applied electric field is imposed. A plurality of memory cells, which may be referred to as an array, forms a memory device. In this connection, memory cells may function as MOSFETs.

Figure 3:
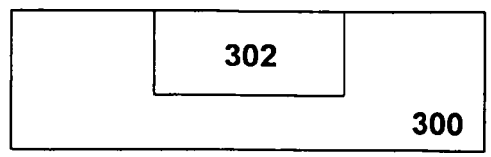
FIGS. 3 to 8 are cross sectional illustrations of a semiconductor substrate of a memory cell undergoing fabrication according to one aspect of the subject invention.

Referring to FIGS. 3 to 8 and FIGS. 9 to 14, two of many possible exemplary embodiments of a memory cell structure and a method of forming a memory cell in accordance with the subject invention are illustrated. Referring to FIG. 3, a substrate layer 300 containing a first electrode layer 302 is provided. The substrate layer 300 may be a layer of a dielectric (e.g., silicon). In one embodiment, the first electrode layer 302 contains copper or a copper alloy.

Figure 4:
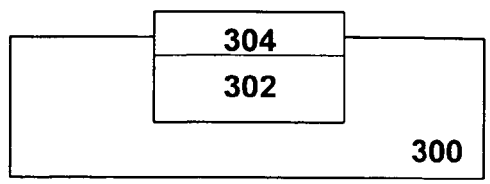

Referring to FIG. 4, a copper sulfide passive layer 304 is formed over the first electrode layer 302 by using a gas treatment, in which a sulfide compound (for example, hydrogen sulfide, lithium sulfide, sodium sulfide, potassium sulfide) is contacted with the copper-containing first electrode 302 for a time and at a temperature sufficient to facilitate formation of copper sulfide, for example for a time from about 1 second to about 3 minutes at a temperature from about 150° C. to about 500° C. In one embodiment, the passive layer 304 has a thickness of about 50 Å.

Figure 5:
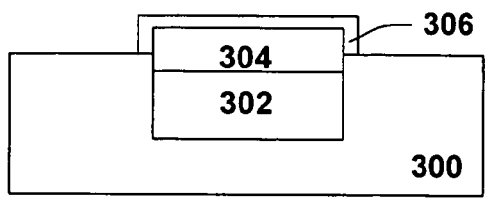

Referring to FIG. 5, a copper oxide layer 306 is formed by exposing the surface of the copper sulfide passive layer 304 to ambient air. In this embodiment, the copper oxide layer 306 has a thickness of about 20 Å.

Figure 6:
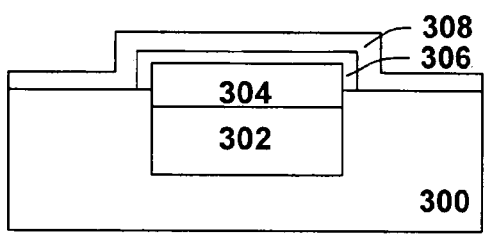

Referring, FIG. 6, a tantalum layer 308 is formed over the substrate using PVD deposition. In this embodiment, in PVD deposition a substrate temperature is maintained from about 150° C. to about 250° C., a sputtering gas flow rate from about 30 sccm to about 40 sccm, the target DC bias from about 1,000 W to about 4,000 W. In this embodiment, the tantalum layer 308 has a thickness of about 25 Å.

Figure 7:
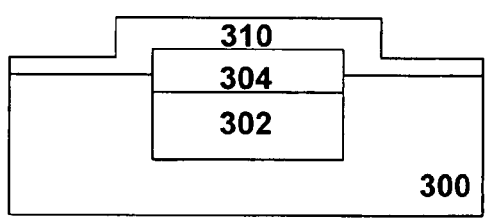

Referring to FIG. 7, the tantalum layer 308 is converted to a Cu-doped tantalum oxide layer 310. The tantalum layer 308 is oxidized with oxygen from the underlining copper oxide layer and ambient air, and converted to a tantalum oxide layer. In this embodiment, the tantalum oxide layer has a thickness of about 50 Å. When the tantalum layer 308 is oxidized with oxygen from the copper oxide layer, the copper oxide layer is reduced to copper. The copper diffuses into the tantalum oxide layer, thus doping the tantalum oxide layer with copper. In this embodiment, the substrate is heated for oxidizing and doping for a time about 30 minutes at a temperature from about 100° C. to about 300° C. In this embodiment, the Cu-coped tantalum oxide layer 310 has a thickness of about 70 Å.

Figure 8:
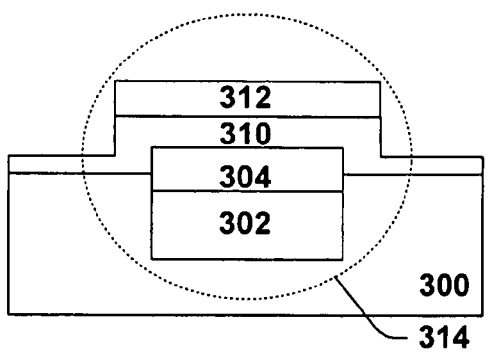

Referring to FIG. 8, another electrode 312 is formed over the Cu-doped metal oxide layer 310 to provide a memory cell 314. In one embodiment, the second electrode 312 contains aluminum or an aluminum alloy.

Figure 9:
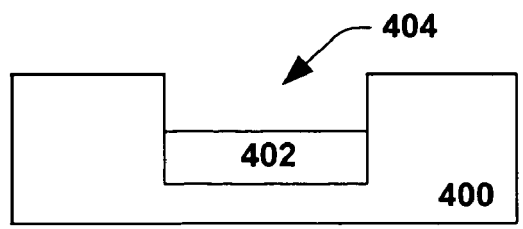
FIGS. 9 to 14 are cross sectional illustrations of a semiconductor substrate of a memory cell undergoing fabrication according to one aspect of the subject invention.

Referring FIG. 9, in another embodiment, a dielectric layer 400 and a first electrode 402 in the recessed area 404 in the layer are provided. In this example, the first electrode 402 is a copper alloy.

Figure 10:
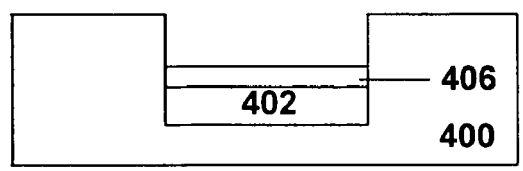

Referring to FIG. 10, a copper sulfide passive layer 406 is formed over the first electrode layer 402 by using a gas treatment, in which a sulfide compound (for example, hydrogen sulfide, lithium sulfide, sodium sulfide, potassium sulfide) is contacted with the copper structure for a time and at a temperature sufficient to facilitate formation of copper sulfide, for example for a time from about 1 second to about 3 minutes at a temperature from about 150° C. to about 500° C. In one embodiment, the passive layer has a thickness of about 40 Å.

Figure 11:
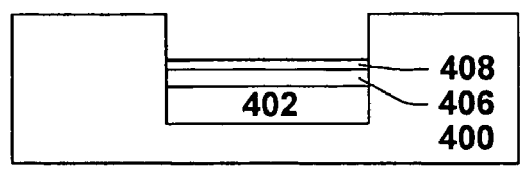

Referring to FIG. 11, a copper oxide layer 408 is formed by exposing the surface of the copper sulfide passive layer 406 to air ambient. In this embodiment, the copper oxide layer 408 has a thickness of about 20 Å.

Figure 12:
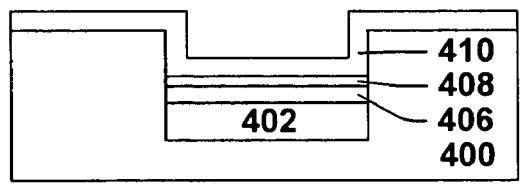

Referring to FIG. 12, a titanium layer 410 is formed over the substrate using PVD deposition. In this embodiment, in PVD deposition a wafer temperature is maintained from about 100° C. to about 250° C., a sputtering gas flow rate from about 60 sccm to about 70 sccm, the target DC bias from about 500 W to about 600 W. In this embodiment, the titanium layer 410 has a thickness of about 20 Å.

Figure 13:
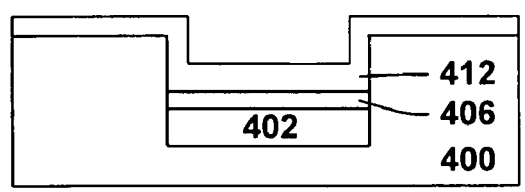

Referring to FIG. 13, the titanium layer 410 is converted to a Cu-doped titanium oxide layer 412. The titanium layer 410 is oxidized with oxygen from the underlining copper oxide layer 408 and ambient air, and converted to a titanium oxide layer 412. When the titanium layer 410 is oxidized with oxygen from the copper oxide layer 408, the copper oxide layer 408 is reduced to copper. The copper diffuses into the titanium oxide layer 412, thus doping the tantalum oxide layer with copper. In this embodiment, the substrate is heated for oxidizing and doping for a time about 20 minutes at a temperature from about 100° C. to about 300° C. In this embodiment, the Cu-doped titanium oxide layer has a thickness of about 60 Å.

Figure 14:
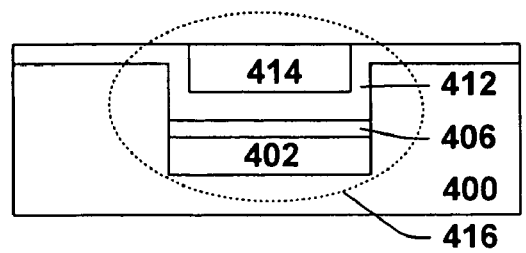

Referring to FIG. 14, a second electrode 414 is formed over the Cu-doped titanium oxide layer 412 to provide memory cell 416. In one embodiment, the second electrode 414 contains aluminum.

The memory cells/devices are useful in any device requiring memory. For example, the memory devices are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and lightweight of the memory devices. Examples of hand-held devices include cell phones and other two way communication devices, personal data assistants, Palm Pilots, pagers, notebook computers, remote controls, recorders (video and audio), radios, small televisions and web viewers, cameras, and the like.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A memory cell comprising:
   a first electrode and a second electrode;
   a controllably conductive media between the first and second electrodes, the controllably conductive media comprising a passive layer and an active layer, the passive layer comprising at least copper sulfide, the active layer comprising a Cu-doped metal oxide layer comprising at least one of tantalum oxide and titanium oxide.

2. The memory cell of claim 1, wherein the first electrode comprises at least copper.

3. The memory cell of claim 2, wherein the passive layer comprising at least copper sulfide is formed by contacting a sulfide compound with the first electrode comprising at least copper.

4. The memory cell of claim 1, wherein the Cu-doped metal oxide layer comprising at least one of tantalum oxide and titanium oxide has a thickness of about 25 Å or more and about 110 Å or less.

5. The memory cell of claim 1, wherein the Cu-doped metal oxide layer comprising at least one of tantalum oxide and titanium oxide is formed by oxidizing a portion of the passive layer comprising copper sulfide layer to form a copper oxide layer, forming a metal layer comprising at least one of tantalum and titanium over the copper oxide layer, by oxidizing the metal layer with oxygen from the copper oxide layer to form a metal oxide layer comprising at least one of tantalum oxide and titanium oxide, and by doping the metal oxide layer with copper from the copper oxide layer to form the Cu-doped metal oxide layer comprising at least one of tantalum oxide and titanium oxide.

6. The memory cell of claim 5, wherein the copper oxide layer has a thickness of about 5 Å or more and about 50 Å or less and the metal oxide layer has a thickness of about 20 Å or more and about 60 Å or less.

7. The memory cell of claim 1, wherein the second electrode comprises at least aluminum.

8. A method of making a memory cell, comprising:
   providing a dielectric layer having a first electrode formed therein;
   forming a passive layer comprising at least copper sulfide over the first electrode;
   forming a Cu-doped metal oxide layer comprising at least one of tantalum oxide and titanium oxide over the passive layer; and
   forming a second electrode layer over the Cu-doped metal oxide layer.

9. The method of claim 8, wherein the first electrode comprises at least copper.

10. The method of claim 9, wherein the passive layer comprising at least copper sulfide is formed by contacting a sulfide compound with the first electrode comprises at least copper.

11. The method of claim 8, wherein the Cu-doped metal oxide layer comprising at least one of tantalum oxide and titanium oxide is formed by oxidizing a portion of the passive layer comprising copper sulfide layer to form a copper oxide layer, forming a metal layer comprising at least one of tantalum and titanium over the copper oxide layer, by oxidizing the metal layer with oxygen from the copper oxide layer to form a metal oxide layer comprising at least one of tantalum oxide and titanium oxide, and by doping the metal oxide layer with copper from the copper oxide layer to form the Cu-doped metal oxide layer comprising at least one of tantalum oxide and titanium oxide.

12. The method of claim 11, wherein the copper oxide layer has a thickness of about 5 Å or more and about 50 Å or less and the metal oxide layer has a thickness of about 20 Å or more and about 60 Å or less.

13. The method of claim 8, wherein the Cu-doped metal oxide layer comprising at least one of tantalum oxide and titanium oxide has a thickness of about 25 Å or more and about 110 Å or less.

14. The method of claim 8, wherein the second electrode comprises at least aluminum.

15. A memory cell made by:
    providing a dielectric layer having a first electrode formed therein;
    forming a passive layer comprising at least copper sulfide over the first electrode;
    forming a Cu-doped metal oxide layer comprising at least one of tantalum oxide and titanium oxide over the passive layer; and
    forming a second electrode layer over the Cu-doped metal oxide layer.

16. The memory cell of claim 15, wherein the first electrode comprises at least copper.

17. The memory cell of claim 16, wherein the passive layer comprising at least copper sulfide is formed by contacting a sulfide compound with the first electrode comprising at least copper.

18. The memory cell of claim 15, wherein the Cu-doped metal oxide layer comprising at least one of tantalum oxide and titanium oxide is formed by oxidizing a portion of the passive layer comprising copper sulfide layer to form a copper oxide layer, forming a metal layer comprising at least one of tantalum and titanium over the copper oxide layer, by oxidizing the metal layer with oxygen from the copper oxide layer to form a metal oxide layer comprising at least one of tantalum oxide and titanium oxide, and by doping the metal oxide layer with copper from the copper oxide layer to form the Cu-doped metal oxide layer comprising at least one of tantalum oxide and titanium oxide.

19. The memory cell of claim 18, wherein the copper oxide layer has a thickness of about 5 Å or more and about 50 Å or less and the metal oxide layer has a thickness of about 20 Å or more and about 60 Å or less.

20. The memory cell of claim 15, wherein the Cu-doped metal oxide layer comprising at least one of tantalum oxide and titanium oxide has a thickness of about 25 Å or more and about 110 Å or less.

21. The memory cell of claim 15, wherein the second electrode comprises at least aluminum.

* * * * *